United States Patent
Stevens et al.

(10) Patent No.: US 11,086,238 B2
(45) Date of Patent: Aug. 10, 2021

(54) SYSTEM, A LITHOGRAPHIC APPARATUS, AND A METHOD FOR REDUCING OXIDATION OR REMOVING OXIDE ON A SUBSTRATE SUPPORT

(71) Applicant: ASML NETHERLANDS B.V., Veldhoven (NL)

(72) Inventors: Lucas Henricus Johannes Stevens, Eindhoven (NL); Nina Vladimirovna Dziomkina, San Diego, CA (US); Laura Maria Fernandez Diaz, Eindhoven (NL); Johannes Adrianus Cornelis Maria Pijnenburg, Moergestel (NL)

(73) Assignee: ASML Netherlands B.V., Veldhoven (NL)

( * ) Notice: Subject to any disclaimer, the term of this patent is extended or adjusted under 35 U.S.C. 154(b) by 13 days.

(21) Appl. No.: 16/623,898

(22) PCT Filed: Jun. 8, 2018

(86) PCT No.: PCT/EP2018/065180
§ 371 (c)(1),
(2) Date: Dec. 18, 2019

(87) PCT Pub. No.: WO2019/001931
PCT Pub. Date: Jan. 3, 2019

(65) Prior Publication Data
US 2020/0150549 A1    May 14, 2020

(30) Foreign Application Priority Data

Jun. 29, 2017 (EP) .................................... 17178743

(51) Int. Cl.
*G03F 7/20* (2006.01)
*H01L 21/687* (2006.01)

(52) U.S. Cl.
CPC ...... *G03F 7/70925* (2013.01); *G03F 7/70908* (2013.01); *G03F 7/70975* (2013.01); *H01L 21/6875* (2013.01)

(58) Field of Classification Search
CPC ............. G03F 7/70708; G03F 7/70866; G03F 7/70908; G03F 7/70916; G03F 7/70925; H01L 21/6875; H01L 21/68757
(Continued)

(56) References Cited

U.S. PATENT DOCUMENTS 5,946,184 A      8/1999  Kanno et al.
9,093,481 B2 *  7/2015  Levinson .......... H01L 21/67028
(Continued)

FOREIGN PATENT DOCUMENTS

CN      1178392      4/1998
CN      1358328      7/2002
(Continued)

OTHER PUBLICATIONS

Japanese Office Action issued in corresponding Japanese Patent Application No. 2019-568642, dated Nov. 11, 2020.
(Continued)

*Primary Examiner* — Colin W Kreutzer
(74) *Attorney, Agent, or Firm* — Pillsbury Winthrop Shaw Pittman LLP (57) ABSTRACT

A system including: a substrate support configured to hold a substrate; a conductive or semi-conductive element contacting the substrate support and covering at least part of the substrate support; and a charging device configured to apply a positive potential to the conductive or semi-conductive element with respect to the part of the substrate support that is covered by the conductive or semi-conductive element.

21 Claims, 5 Drawing Sheets

(58) Field of Classification Search
USPC .................................. 355/30, 72, 75, 77
See application file for complete search history.

(56) References Cited

U.S. PATENT DOCUMENTS

| | | |
|---|---|---|
| 2001/0019472 A1 | 9/2001 | Kanno et al. |
| 2005/0041225 A1 | 2/2005 | Sengers et al. |
| 2006/0097201 A1* | 5/2006 | Neerhof .............. G03F 7/70783 |
| | | 250/504 R |
| 2006/0109447 A1 | 5/2006 | Moest et al. |
| 2006/0237667 A1 | 10/2006 | Ruzic et al. |
| 2010/0258144 A1 | 10/2010 | Broz et al. |
| 2011/0037960 A1* | 2/2011 | Scaccabarozzi .... G03F 7/70925 |
| | | 355/30 |
| 2012/0147353 A1 | 6/2012 | Lafarre et al. |
| 2013/0189802 A1 | 7/2013 | Tromp et al. |
| 2015/0124234 A1 | 5/2015 | Lafarre et al. |

FOREIGN PATENT DOCUMENTS

| | | |
|---|---|---|
| CN | 1407602 | 4/2003 |
| CN | 103219164 | 7/2013 |
| JP | H10150100 | 6/1998 |
| JP | 2006040993 | 2/2006 |
| JP | 2008135736 | 6/2008 |
| JP | 2012129524 | 7/2012 |
| JP | 2013138190 | 7/2013 |
| KR | 20020091337 | 12/2002 |
| KR | 20090013552 | 2/2009 |
| WO | 2016081951 | 5/2016 |

OTHER PUBLICATIONS

International Search Report and Patent Application No. PCT/EP2018/065180, Written Opinion issued in corresponding PCT dated Sep. 11, 2018.
Chinese Office Action issued in corresponding Chinese Patent Application No. 201380044201.8, dated Mar. 11, 2021.

* cited by examiner

SYSTEM, A LITHOGRAPHIC APPARATUS, AND A METHOD FOR REDUCING OXIDATION OR REMOVING OXIDE ON A SUBSTRATE SUPPORT

CROSS-REFERENCE TO RELATED APPLICATIONS

This application is the U.S. national phase entry of PCT Patent Application No. PCT/EP2018/065180, which was filed on Jun. 8, 2018, which claims the benefit of priority of European Patent Application No. 17178743.5, which was filed on Jun. 29, 2017 and which is incorporated herein in its entirety by reference.

FIELD

The present invention relates to a system, a lithographic apparatus, and a method for reducing oxidation or removing oxide on a substrate support.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

To project a pattern on the substrate the lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on the substrate than a lithographic apparatus which uses, for example, radiation with a wavelength of 193 nm.

The substrate is clamped onto a substrate support of a substrate table in the lithographic apparatus when transferring a pattern from the patterning device. A substrate support conventionally has a plurality of projections extending in a first (z) direction (called burls) to support the substrate. The total area of terminal surfaces of the burls that contact the substrate thereby to support the substrate is small compared to the total area of a substrate. Therefore, the chance that a contaminant particle randomly located on the surface of the substrate or the substrate support is trapped between a burl and the substrate is small. Also, in manufacture of the substrate support, the tops of the burls can be made more accurately coplanar than a large surface can be made accurately flat.

When a substrate is first loaded onto the substrate support in preparation for exposure, the substrate is supported by so-called e-pins which hold the substrate at multiple positions. To load the substrate onto the substrate support, the e-pins are retracted so that the substrate is supported by burls of the substrate support. While the substrate is being held by the e-pins, its own weight will cause the substrate to distort, e.g. becoming convex when viewed from above. To load the substrate onto the substrate support, the e-pins are retracted so that the substrate is supported by burls of the substrate support. As the substrate is lowered onto the burls of the substrate support, the substrate will contact in some places, e.g. near the edge, before other places, e.g. near the center. Friction between the burls and the lower surface of the substrate may prevent the substrate from fully relaxing into a flat unstressed state.

The flatness of the terminal surfaces of the burls (i.e. how close to being in the same plane all of the terminal surfaces of the burls are) and the coefficient of friction between the terminal surfaces of the burls and a substrate are important. This is because any variation in the flatness of the burls is transmitted to the top surface of the substrate which is subjected to irradiation. Any variation in the coefficient of friction may prevent the substrate from relaxing uniformly when lowered onto the burls, such that a non-uniform residual curvature is retained. However, after multiple substrate processing cycles, the height of the burls and their coefficient of friction may non-uniformly deviate from a desired starting level. Any such deviation can lead to focus and/or overlay errors in a substrate.

A substrate support is periodically cleaned by moving a treatment tool over the terminal surfaces (in directions orthogonal to the first direction), thereby to remove contamination from the substrate support. One such treatment tool is disclosed in WO 2016/081951. However, such mechanical cleaning cannot fully restore an initial level of flatness and a uniform coefficient of friction across the whole substrate. Further, the treatment tool may cause damage to the substrate support and interfere with production of a lithographic apparatus.

SUMMARY

It is desirable, for example, to provide an improved system for maintaining a high degree of flatness and a uniform coefficient of friction of the terminal surfaces of the burls.

According to an aspect of the invention, there is provided a system comprising a substrate support configured to hold a substrate, a conductive or semi-conductive element contacting the substrate support and covering at least part of the substrate support, and a charging device configured to apply a positive potential to the conductive or semi-conductive element with respect to the part of the substrate support that is covered by the conductive or semi-conductive element.

According to another aspect of the invention, there is provided a lithographic apparatus comprising a substrate table that comprises a substrate support configured to hold a substrate, a loading device configured to load a conductive or semi-conductive element onto the substrate support, so that the conductive or semi-conductive element contacts the substrate support and covers at least part of the substrate support, and a charging device configured to apply a positive potential to a conductive or semi-conductive element contacted by the substrate support with respect to the part of the substrate support that is covered by the conductive or semi-conductive element.

According to another aspect of the invention, there is provided a method for reducing oxidation or removing oxide on a substrate support, the method comprising contacting the substrate support with a conductive or semi-conductive element such that at least part of the substrate support is covered by the conductive or semi-conductive element, and applying a positive potential to the conductive or semi-conductive element with respect to the part of the substrate support that is covered by the conductive or semi-conductive element.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
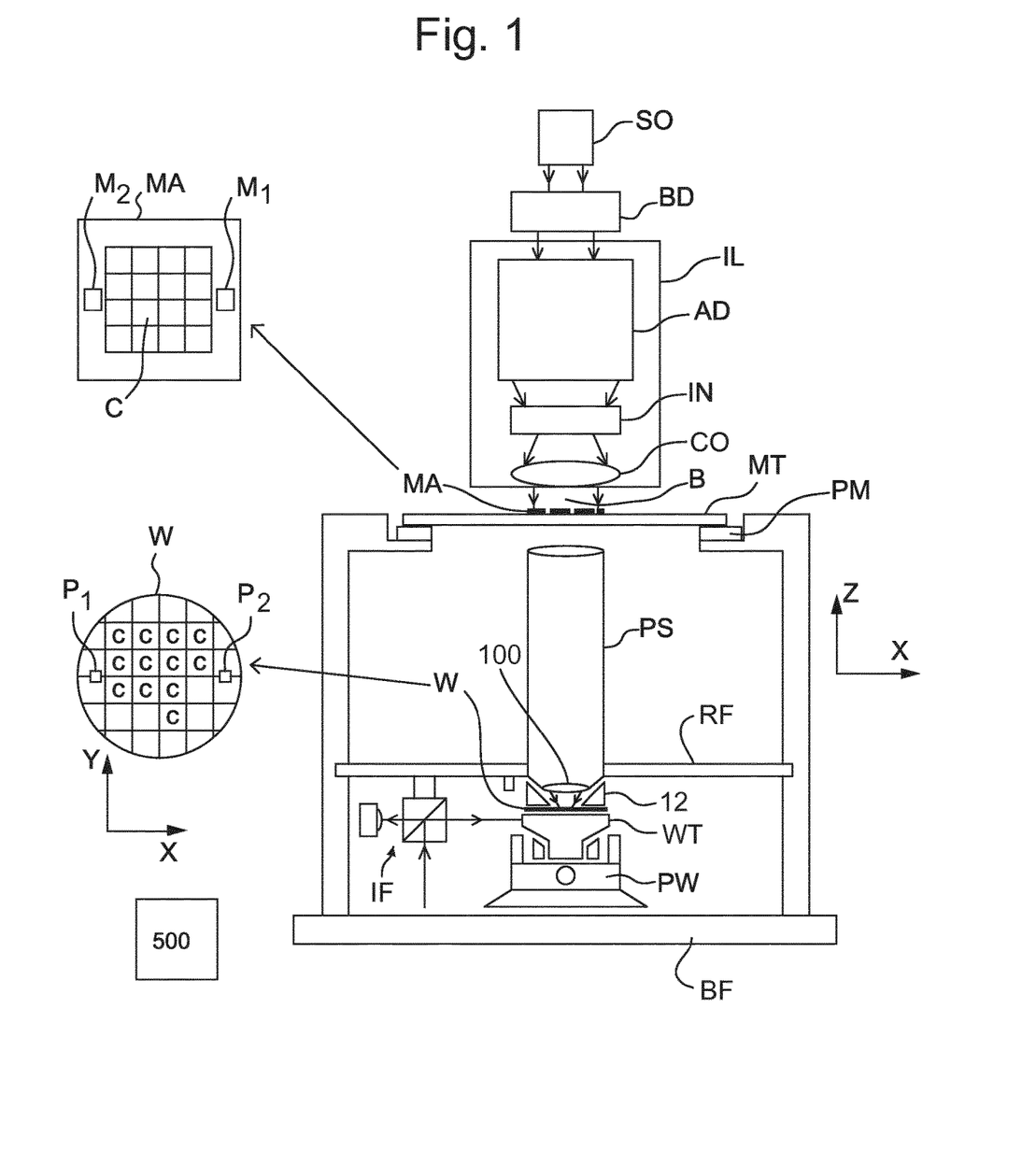
FIG. 1 schematically depicts a lithographic apparatus.

FIG. 1 schematically depicts a lithographic apparatus of an embodiment. The apparatus comprises:

- optionally, an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device MA in accordance with certain parameters;
- a support table, e.g. a sensor table to support one or more sensors or a substrate table or wafer table WT constructed to hold a substrate (e.g. a resist-coated substrate) W, connected to a second positioner PW configured to accurately position the surface of the table, for example of a substrate W, in accordance with certain parameters; and
- a projection system (e.g. a refractive projection lens system) PS configured to project a pattern imparted to the radiation beam B by patterning device MA onto a target portion C (e.g. comprising part of, one, or more dies) of the substrate W.

The lithographic apparatus may be of a type wherein at least a portion of the substrate W may be covered by an immersion liquid having a relatively high refractive index, e.g. water such as ultra pure water (UPW), so as to fill an immersion space between the projection system PS and the substrate W. An immersion liquid may also be applied to other spaces in the lithography apparatus, for example, between the patterning device MA and the projection system PS Immersion techniques can be used to increase the numerical aperture of projection systems. The term "immersion" as used herein does not mean that a structure, such as a substrate W, must be submerged in immersion liquid; rather "immersion" only means that an immersion liquid is located between the projection system PS and the substrate W during exposure. The path of the patterned radiation beam B from the projection system PS to the substrate W is entirely through immersion liquid. In an arrangement for providing immersion liquid between a final optical element of the projection system PS and the substrate W a liquid confinement structure 12 extends along at least a part of a boundary of an immersion space between the final optical element of the projection system PS and the facing surface of the stage or table facing the projection system PS.

In operation, the illuminator IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system".

The lithographic apparatus may be of a type having two or more support tables, e.g., two or more support tables or a combination of one or more support tables and one or more cleaning, sensor or measurement tables. For example, the lithographic apparatus is a multi-stage apparatus comprising two or more tables located at the exposure side of the projection system, each table comprising and/or holding one or more objects. In an example, one or more of the tables may hold a radiation-sensitive substrate. In an example, one or more of the tables may hold a sensor to measure radiation from the projection system. In an example, the multi-stage apparatus comprises a first table configured to hold a radiation-sensitive substrate (i.e., a support table) and a second table not configured to hold a radiation-sensitive substrate (referred to hereinafter generally, and without limitation, as a measurement, sensor and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

In operation, the radiation beam B is incident on the pattern (design layout) present on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W.

With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B at a focused and aligned position. Similarly, the first positioner PM and another position sensor (which is not explicitly depicted in FIG. 1) can be used to accurately position the patterning device MA with respect to the path of the radiation beam B. Patterning device MA and substrate W may be aligned using patterning device alignment marks M1, M2 and substrate alignment marks P1, P2. Although the substrate alignment marks P1, P2 as illustrated occupy dedicated target portions, they may be located in spaces between target portions C (these are known as scribe-lane alignment marks).

A controller 500 controls the overall operations of the lithographic apparatus and in particular performs an operation process described further below. Controller 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus. It will be appreciated that a one-to-one relationship between controlling computer and lithographic apparatus is not necessary. One computer can control multiple lithographic apparatuses. Multiple networked computers can be used to control one lithographic apparatus. The controller 500 may also be configured to control one or more associated process devices and substrate handling devices in a lithocell or cluster of which the lithographic apparatus forms a part. The controller 500 can also be configured to be subordinate to a supervisory control system of a lithocell or cluster and/or an overall control system of a fab.

The substrate table WT comprises a substrate support 60. The substrate support 60 is fixable to the substrate table WT using bolts or by vacuum clamping. The substrate W is conventionally clamped to the substrate support 60 during exposures. Two clamping techniques are commonly used. In vacuum-clamping a pressure differential across the substrate W is established, e.g., by connecting the space between the substrate support 60 and the substrate W to an underpressure that is lower than a higher pressure above the substrate W. The pressure difference gives rise to a force holding the substrate W to the substrate support 60. In electrostatic clamping, electrostatic forces are used to exert a force between the substrate W and the substrate support 60. Several different arrangements are known to achieve this. In one arrangement a first electrode is provide on the lower surface of the substrate W and a second electrode on the upper surface of the substrate support 60. A potential difference is established between the first and second electrodes. In another arrangement two semi-circular electrodes are provided on the substrate support 60 and a conductive layer is provided on the substrate W. A potential difference is applied between the two semi-circular electrodes so that the two semi-circular electrodes and the conductive layer on the substrate W act like two capacitors in series.

To load a substrate W onto the substrate support 60 for exposures, the substrate W is picked up by a substrate handler robot and lowered onto a set of e-pins. The e-pins project through the substrate support 60. The e-pins are actuated so that they can extend and retract. The e-pins may be provided with suction openings at their tips to grip the substrate W. The e-pins may comprise, for example, six e-pins spaced around the center of the substrate support 60. Once the substrate W has settled on the e-pins, the e-pins are retracted so that the substrate W is supported by burls or projections 20 of the substrate support 60.

Figure 2:
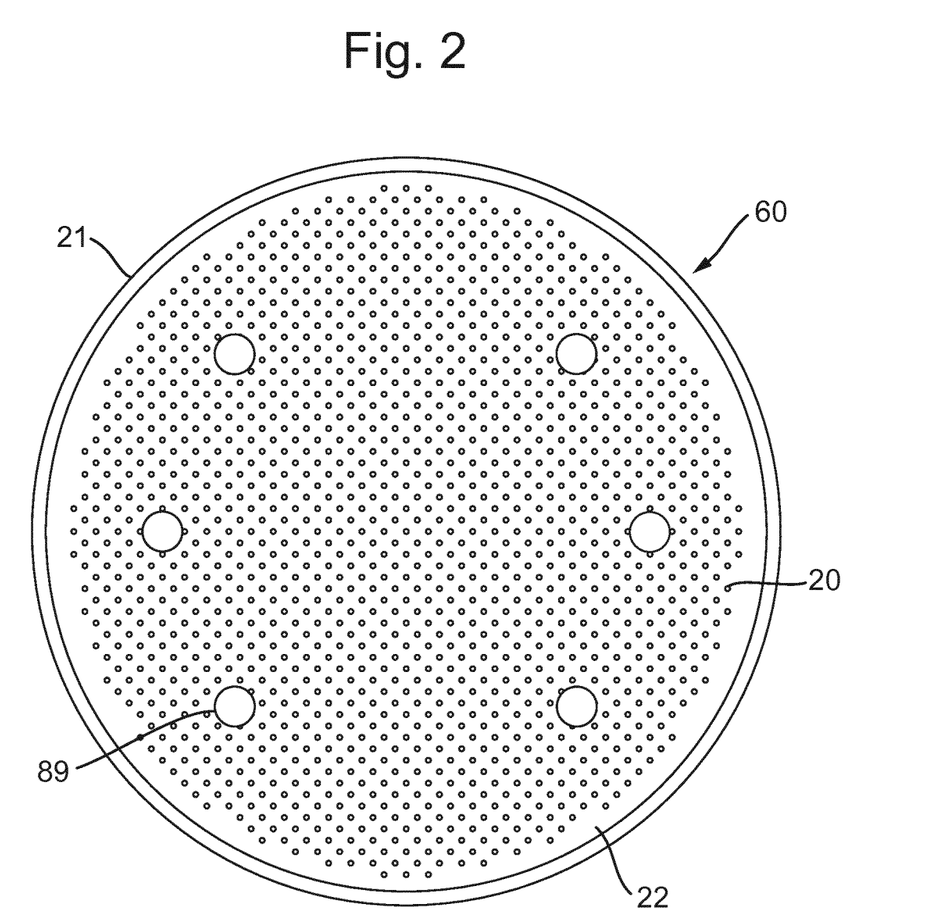
FIG. 2 depicts in plan a substrate support.

FIG. 2 depicts, in plan, a substrate support 60 for use in a lithographic apparatus. The substrate support 60 supports a substrate W. The substrate support 60 comprises a main body 21. The main body 21 has a main body surface 22. A plurality of burls or projections 20 are provided projecting from the main body surface 22 in a first (z) direction. A terminal surface of each burl 20 engages (contacts) with the substrate W. The terminal surfaces of the burls 20 substantially conform to a support plane and support the substrate W. Main body 21 and burls 20 may be formed of SiSiC, a ceramic material having silicon carbide (SiC) grains in a silicon matrix. Alternatively, main body 21 and burls 20 may be formed of SiC.

A plurality of through-holes 89 may be formed in the main body 21. Through-holes 89 allow the e-pins to project through the substrate support 60 to receive the substrate W. Through-holes 89 may allow the space between a substrate W and the substrate support 60 to be evacuated. Evacuation of the space between a substrate W and the substrate support 60 can provide a clamping force, if the space above the substrate W is not also evacuated. The clamping force holds the substrate W in place. If the space above the substrate W is also evacuated, as would be the case in a lithographic apparatus using EUV radiation, electrodes can be provided on the substrate support 60 to form an electrostatic clamp.

Figure 3:
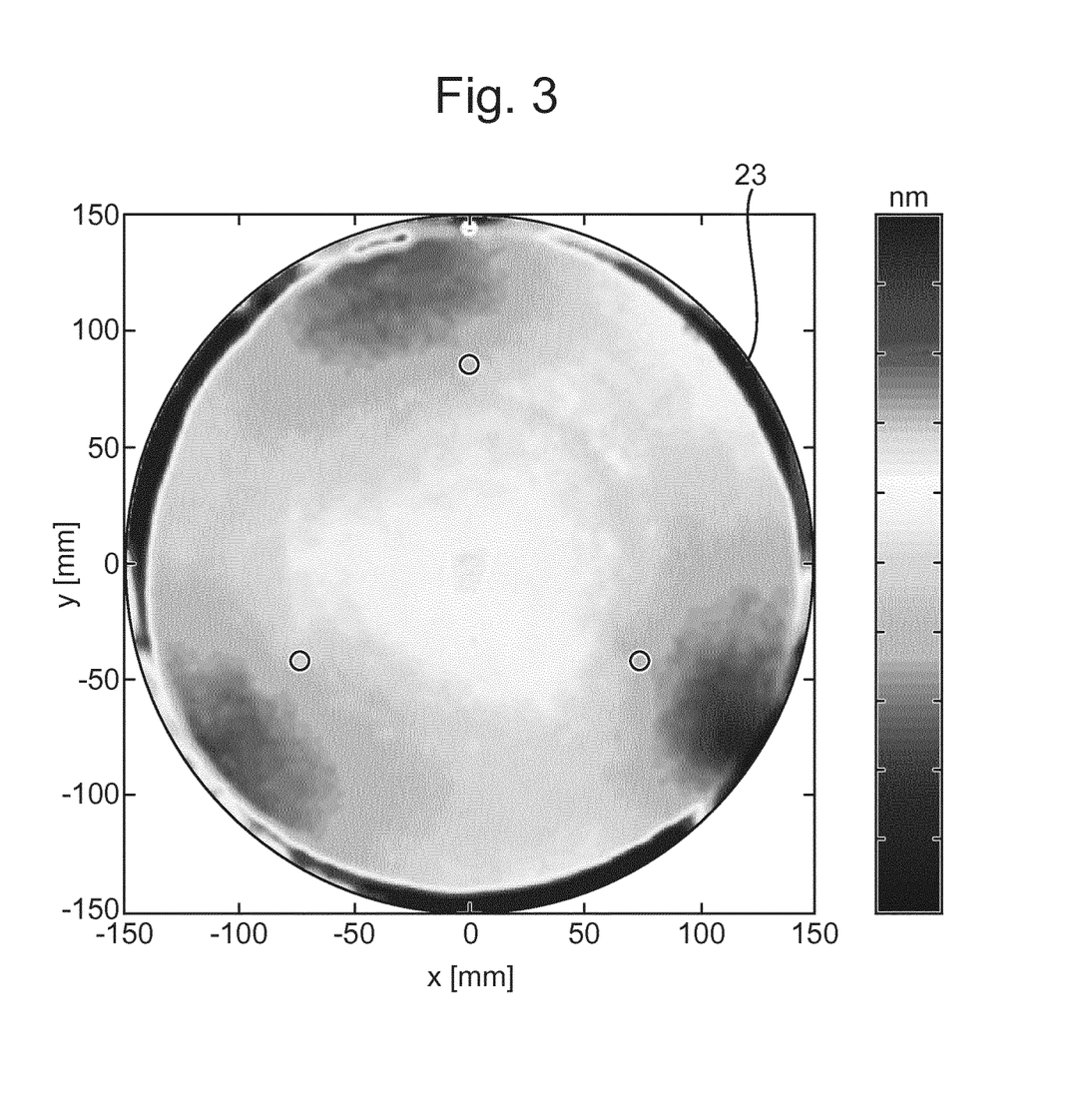
FIG. 3 shows a flatness measurement of a substrate support that illustrates the problematic oxide growth.

FIG. 3 is a typical map of the relative height of the terminal surfaces of the burls 20 of the substrate support 60 after multiple production cycles. This map shows a variation in the height of the terminal surfaces of the burls 20. The deviation from a desired level is plotted in the x and y directions. The burls 20 at the edge 23 of the substrate support 60 exhibit a significant increase in height. The degree of flatness of the substrate support 60 is greatly reduced from the starting flatness before any production cycles. The inventors have found that this variation in burl 20 height is caused by the formation of an oxide on the substrate support 60.

The oxide may grow on the terminal surfaces of the burls 20 of the substrate support 60. The oxide may be silicon oxide. This oxide grows in a non-uniform manner. This makes compensating for the growth of the oxide problematic. The non-uniform oxide reduces the degree of flatness of the substrate support 60. Furthermore, the non-uniform oxide, if present on the terminal surfaces of the burls 20, leads to a variation in the coefficient of friction between the terminal surfaces of the burls 20 and a substrate. A substrate W may thus not evenly relax when first loaded onto the substrate support 60, such that it maintains a non-uniform residual curvature. As the oxide grows over time, the degree of flatness and the variation in coefficient of friction vary over time. The oxide is less resistive to mechanical wear than the substrate support 60 made of SiSiC or SiC, which results in an accelerated wear and reduction of flatness of the substrate support 60. The reduced flatness and non-uniform coefficient of friction across the substrate support 60 surface may lead to focus and/or overlay errors in the substrate W held by the substrate support 60.

The inventors have, for the first time, found that the oxide growth is induced electrochemically. This is surprising, as the substrate W or the substrate support 60 are not actively charged, and no electrolyte is deliberately provided. However, the inventors have found that a low degree of residual moisture in a lithographic apparatus, and minor positive charging effects of the substrate support 60 relative to the substrate W during production, are responsible for the oxide growth. Moisture may stem, for example, from the liquid confinement structure 12 handling the immersion liquid of a lithographic apparatus. However, moisture may be present even in a lithographic apparatus without immersion liquid, for example in the form of humid air that may enter the lithographic apparatus during loading and unloading of the substrate W. This is possible even in an EUV lithographic apparatus where illumination occurs in a vacuum. This moisture may act as an electrolyte that enables oxidation. It is further believed that the driving force giving rise to oxidation may stem from residual negative static charges on the substrate W loaded onto a substrate support 60. Such charges may be induced in the substrate W, for example, during a pre-alignment process of the substrate W on the substrate support 60.

The present invention has been developed based on this new understanding of the mechanisms underlying oxide growth on a substrate support 60. The present invention serves to prevent or reduce oxide growth on a substrate support 60 or to remove an already grown oxide from a substrate support 60.

Figure 4:
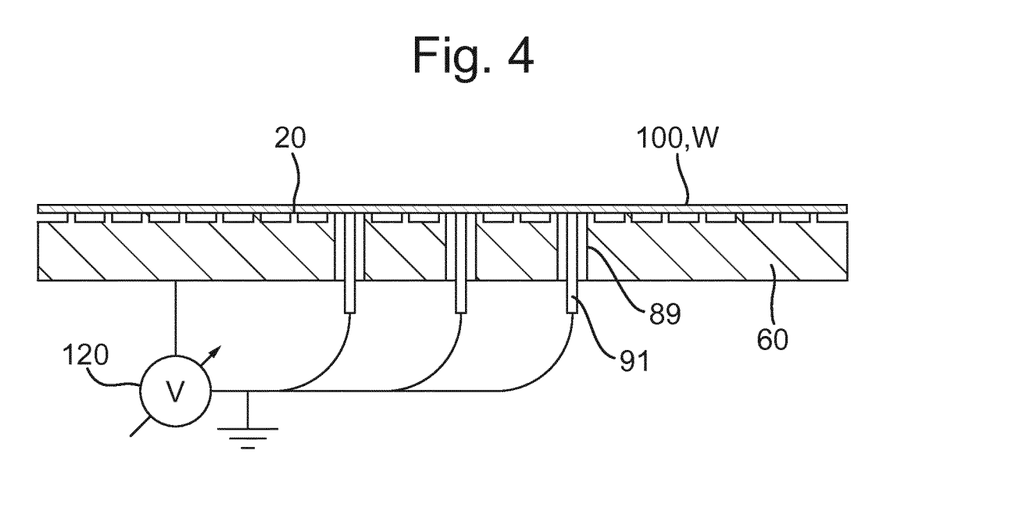
FIG. 4 schematically depicts in cross-section a system for preventing or reducing oxide growth on a substrate support during production in accordance with an embodiment.
Figure 5:
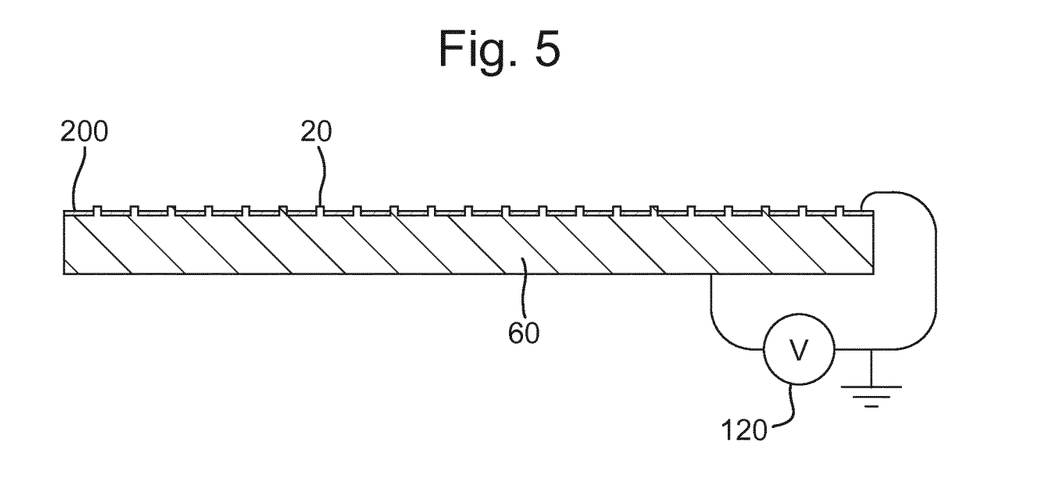
FIG. 5 schematically depicts in cross-section another embodiment for preventing or reducing oxide growth on a substrate support using a metal layer on the substrate support.
Figure 6:
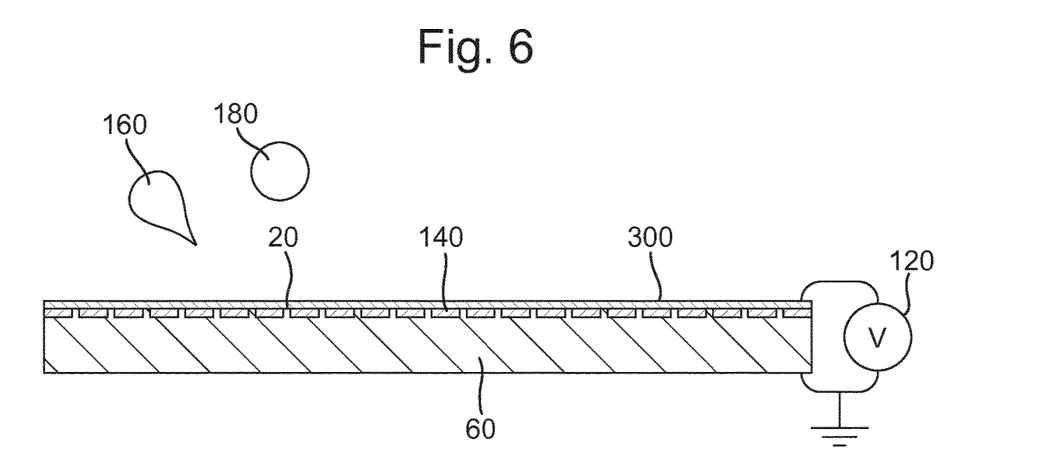
FIG. 6 schematically depicts in cross-section a system for removing oxide from a substrate support using a dummy substrate in accordance with an embodiment.
Figure 7:
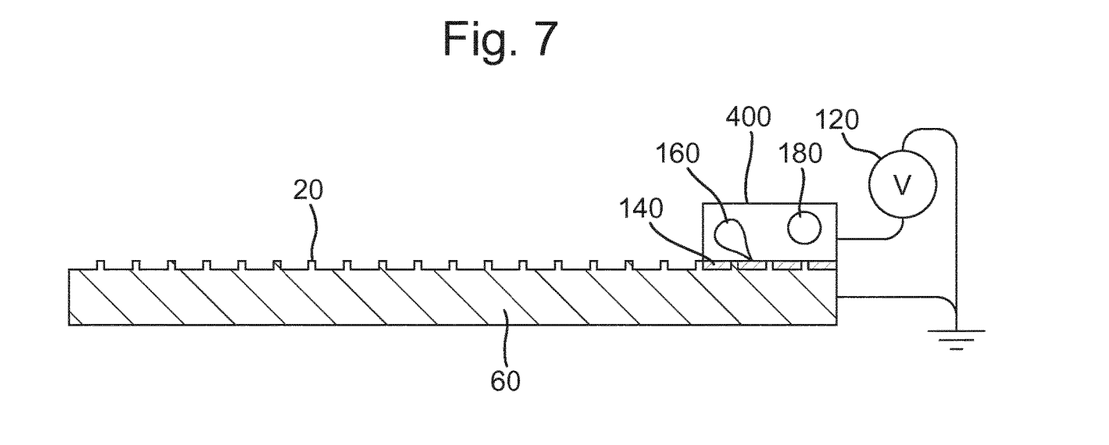
FIG. 7 schematically depicts in cross-section another embodiment for removing oxide from a substrate support using a mechanical treatment tool.

Experiments conducted by the inventors have shown that oxide growth on a substrate support 60 is affected by an electrical field that is provided between the substrate W and a substrate support 60. Applying a positive voltage or potential difference between the substrate support 60 and substrate W, such that the substrate W has a positive potential with respect to the substrate support 60, has been shown to decrease the rate of oxide growth on the substrate support 60, or to prevent it all together, or even to remove an oxide from the substrate support 60. Conversely, applying a negative voltage or potential difference between the substrate support 60 and substrate W, such that the substrate W has a negative potential with respect to the substrate support 60, has been shown to increase the rate of oxide growth on the substrate support 60. The inventors have developed a system that takes advantage of this effect. FIGS. 4 to 7 schematically show exemplary embodiments of the system according to the present invention. The systems of FIGS. 4 and 5 are for reducing or preventing oxide growth on a substrate support 60. The systems of FIGS. 6 and 7 are for removing an oxide from a substrate support 60.

Each of the systems of FIGS. 4 to 7 according to the present invention comprises a substrate support 60, a conductive or semi-conductive element 100, 200, 300, 400 and a charging device 120. In each of the systems of FIGS. 4 to 7, the conductive or semi-conductive element 100, 200, 300, 400 contacts the substrate support 60 and covers at least part of the substrate support 60. Furthermore, in each of these systems the charging device 120 applies a positive potential to the conductive or semi-conductive element 100, 200, 300, 400 with respect to the part of the substrate support 60 that is covered by the conductive or semi-conductive element 100, 200, 300, 400. By bringing the conductive or semi-conductive element 100, 200, 300, 400 into contact (e.g. direct physical contact, for example including any oxide on the substrate support 60) with the substrate support 60, and applying a positive potential between the conductive or semi-conductive element 100, 200, 300, 400 and the substrate support 60, an electrical field is formed between the conductive or semi-conductive element 100, 200, 300, 400 and the substrate support 60. The direction of this electrical field is from the conductive or semi-conductive element 100, 200, 300, 400 to the substrate support 60. The electrical field counteracts the electrochemical process that the inventors have identified to be responsible for oxidation of the substrate support 60, so as to protect the substrate support 60 from oxidation. The rate of oxide growth on the substrate support 60 is thus effectively reduced, or such oxide growth prevented all together. The electrical filed counteracting the electrochemical oxidation process even may reverse this process, so as to remove an oxide from the substrate support 60.

Embodiments of the substrate support 60, the conductive or semi-conductive element 100, 200, 300, 400, and the charging device 120 of each of the systems of FIGS. 4 to 7, as well as the interaction and operation of these components, will first be described in general in the below. Then, the systems illustrated schematically in FIGS. 4 to 7 will be described in specific detail. It will be apparent, that each of the components of the specific examples of FIGS. 4 to 7 may be replaced by the embodiments described generally in the paragraphs below, and that each of the components may operate as described generally in the paragraphs below.

In each of FIGS. 4 to 7, the substrate support 60 may hold a substrate W. The substrate support 60 may be part of the lithographic apparatus described above. A conductive or semi-conductive element 100, 200, 300, 400 contacts the substrate support 60. The conductive or semi-conductive element 100, 200, 300, 400 may contact the terminal end surfaces of the burls 20 of the substrate support 60, or may contact a main body 21 surface of the substrate support 60. As such, the conductive or semi-conductive element 100, 200, 300, 400 is in close proximity to the substrate support 60. This proximity ensures that the electrical field generated between the conductive or semi-conductive element 100, 200, 300, 400 and the substrate support 60 is strong enough to counteract the electrochemical oxidation process of the substrate support 60.

The conductive or semi-conductive element 100, 200, 300, 400 may, for example, be a substrate (i.e. a substrate to be processed and developed into a product) W, 100 that is held by the substrate support 60 and that comprises a photoresist for development of a pattern therein (as shown in FIG. 4), a metal layer 200 that is applied to the main body surface 22 of the substrate support 60 from which surface the plurality of burls 20 project (as shown in FIG. 5), a dummy substrate 300 held by the substrate support 60 (as shown in FIG. 6), or a treatment tool 400 for mechanically cleaning the substrate support 60 (as shown in FIG. 7). The conductive or semi-conductive element 100, 200, 300, 400 may alternatively be any other element that is conductive or semi-conductive and which contacts the substrate support 60.

The conductive or semi-conductive element 100, 200, 300, 400 covers at least part of the substrate support 60, or part of the surface of the substrate support 60. The conductive or semi-conductive element 100, 200, 300, 400 may cover an upper surface or part of an upper surface, i.e., the main body surface 22, of the substrate support 60, which upper surface faces towards the substrate W when the substrate W is held by the substrate support 60. This ensures that the part of the substrate support 60 that holds a substrate W during production is protected from oxidation, such that the substrate W can be maintained in a flat state. The conductive or semi-conductive element 100, 200, 300, 400 covers, in plan, the part of the surface of the substrate support 60 over which the conductive or semi-conductive element 100, 200, 300, 400 is placed. The part of the substrate support 60 that is covered by the conductive or semi-conductive element 100, 200, 300, 400 may coincide with the part of the substrate support 60 that is covered by the substrate W when the substrate W is held by the substrate support 60. This ensures that substantially the whole area, or all of the area, of the substrate support 60 holding the substrate W during production is protected from oxidation, or an oxide can be removed from all of this area. The flatness of the substrate W held by the substrate support 60 can thus be optimally maintained at an initial desired level by preventing or reducing oxidation, or can be enhanced by removing an oxide. The conductive or semi-conductive element 100, 200, 300, 400 may cover the plurality of burls 20, or each of the plurality of burls 20, that extends from the upper surface of the substrate support 60 and holds the substrate W during production. This ensures that the plurality of burls 20 can be protected from oxidation, or that an oxide can be removed from the plurality of burls 20. This is particularly desirable because the burls 20 are in direct contact with the substrate W during production and hold the substrate W, such that oxidation of the burls 20 directly influences the flatness of the substrate W.

In each of the systems of FIGS. 4 to 7, a charging device 120 applies a positive voltage or potential to the conductive or semi-conductive element 100, 200, 300, 400 with respect to the part (or the whole part) of the substrate support 60 that is covered by the conductive or semi-conductive element 100, 200, 300, 400. The potential difference between the substrate support 60 and the conductive or semi-conductive element 100, 200, 300, 400 gives rise to an electrical field counteracting the electrochemical process responsible for oxidation of the substrate support 60, so as to effectively reduce or prevent oxidation, or even remove an already grown oxide. The charging device 120 may apply the positive potential to the conductive or semi-conductive element 100, 200, 300, 400 with respect to the terminal end surfaces of the plurality of burls 20 of the substrate support 60. Oxidation of the terminal end surfaces of the burls 20, that support or hold the substrate W and directly influence the flatness of the substrate W, can thus be effectively prevented or reduced, or an oxide can be removed from the terminal end surfaces of the burls 20. The charging device 120 may apply the positive potential to the conductive or semi-conductive element 100, 200, 300, 400 with respect to the terminal end surfaces of all burls 20 that contact the substrate W when the substrate W is held by the substrate support 60. This ensures that the flatness of the substrate W held by the burls 20 is optimally maintained at an initial desired level by reducing or preventing oxidation, or such an initial desired level is optimally restored by removing an oxide.

The electrical potential of the conductive or semi-conductive element 100, 200, 300, 400 is higher or positive compared to the electrical potential of the substrate support 60. This may be achieved by the charging device 120 by supplying a positive charge, for example by applying a positive voltage, to the conductive or semi-conductive element 100, 200, 300, 400. The charging device 120 may, in addition or alternatively, supply a negative charge, for example by applying a negative voltage, to the substrate support 60. The substrate support 60 may be electrically grounded and a positive potential applied to the conductive or semi-conductive element 100, 200, 300, 400, such that a positive potential is applied to the conductive or semi-conductive element 100, 200, 300, 400 with respect to the substrate support 60. This is advantageous if interference with sensors or other components on the surface of the substrate support 60 is to be reduced or minimized. Alternatively, the conductive or semi-conductive element 100, 200, 300, 400 may be electrically grounded and a negative potential applied to the substrate support 60, such that a positive potential is applied to the conductive or semi-conductive element 100, 200, 300, 400 with respect to the substrate support 60. This is advantageous, for example, if the conductive or semi-conductive element 100, 200, 300, 400 should remain uncharged, for example if the conductive or semi-conductive element 100, 200, 300, 400 is embodied by the substrate W and lithographic processing is carried out on that substrate W.

The charging device 120 may comprise an electrical power supply or voltage source. An electrical power supply allows accurate and reliable control of the positive potential applied to the conductive or semi-conductive element 100, 200, 300, 400 with respect to the substrate support 60. The electrical power supply may apply a positive potential to the conductive or semi-conductive element 100, 200, 300, 400 via e-pins 91 that project through the through-holes 89 of the substrate support 60. This is advantageous, in particular, if the conductive or semi-conductive element 100, 200, 300, 400 is embodied by the substrate W, 100 or a substrate-like device, such as a dummy substrate 300, that can be loaded onto the substrate support 60 using the e-pins 91. The conductive or semi-conductive element 100, 200, 300, 400 may be in electrical contact with the e-pins 91. The electrical power supply may apply a positive potential to the conductive or semi-conductive element 100, 200, 300, 400 via the liquid confinement structure 12 or fluid handling structure. The conductive or semi-conductive element 100, 200, 300, 400 may be in electrical contact with the liquid confinement structure 12. Components already provided in a lithographic apparatus may thus be used to apply a positive potential to the conductive or semi-conductive element 100, 200, 300, 400 with respect to the substrate support 60. This makes implementation of the system in an existing lithographic apparatus simple and cost-effective. Alternatively, the electrical power supply may be embedded in the conductive or semi-conductive element 100, 200, 300, 400. This allows the system to be used independently or substantially independently from the electrical infrastructure of a lithographic apparatus or other device, such that the system can be implemented flexibly in a variety of devices. The charging device 120 may also be an electrical power supply that is embedded in the substrate support 60 and applies a negative bias to the substrate support 60, so as to apply a negative potential to the substrate support 60 with respect to the conductive or semi-conductive element 100, 200, 300, 400. The electrical power supply may be electrically connected to the conductive or semi-conductive element 100, 200, 300, 400 or the substrate support 60 by any means or conductor, such that the conductive or semi-conductive element 100, 200, 300, 400 or the substrate support 60 can be appropriately charged.

The charging device 120 may alternatively direct a radiation beam B onto the conductive or semi-conductive element 100, 200, 300, 400 or the substrate support 60, so as to appropriately charge the conductive or semi-conductive element 100, 200, 300, 400 or the substrate support 60 using a photoelectric effect. The charging device 120 may also be an air shower that directs an airflow over the conductive or semi-conductive element 100, 200, 300, 400 or the substrate support 60, so as to remove electrons from the conductive or semi-conductive element 100, 200, 300, 400 or provide electrons to the substrate support 60. Such an air shower is electrically insulated, and contains an ionizer that pre-ionizes the airflow. The ionizer may be a corona ionizer, and a DC voltage pulse with a positive or negative average voltage can be applied to the corona. The ionized airflow may thus actively apply a positive potential to the conductive or semi-conductive element 100, 200, 300, 400, or a negative potential to the substrate support 60. A positive potential can thus be applied to the conductive or semi-conductive element 100, 200, 300, 400 with respect to the substrate support 60 without physical or electrical contact. The charging device 120 may be any device capable of applying a positive potential to the conductive or semi-conductive element 100, 200, 300, 400 with respect to the substrate support 60.

In each of the systems of FIGS. 4 to 7, the charging device 120 may apply a DC voltage. Applying a DC voltage allows continuous suppression or reduction of oxide growth, or continuous removal of oxide. Alternatively, the charging device 120 may apply a square, sine or saw-tooth voltage wave form, or other voltage wave forms, with peak values as described below, provided the average voltage applied to the conductive or semi-conductive element 100, 200, 300, 400 is positive. Applying a non-DC voltage may be advantageous, in particular, dynamically to counteract any electric fields or ground loops that drive oxidation of the substrate support 60. The non-DC voltage may be chosen to be an inverse of any such electric fields or ground loops.

The charging device 120 applies a positive potential to the conductive or semi-conductive element 100, 200, 300, 400 with respect to the substrate support 60 for the purpose of preventing oxidation of the substrate support 60 or reducing the rate of oxidation of the substrate support 60 (as in the embodiments of FIGS. 4 and 5). In each of the embodiments of FIGS. 4 and 5, the charging device 120 may apply a negative voltage in the range from 0V to −10V, and preferable in the rang from −0.1V to −1.3V, to the substrate support 60 continuously or semi-continuously, so as continuously or semi-continuously to apply a positive potential in the range from 0.1V to 10V, and preferable in the range from 1V to 5V, to the conductive or semi-conductive element 100, 200, 300, 400 with respect to the substrate support 60. The charging device 120 may alternatively apply a negative voltage of up to −100V, or in the range from −5V to −100V, to the substrate support 60 (so as to apply a positive potential in the range from 5V to 100V to the conductive or semi-conductive element 100, 200, 300, 400 with respect to the substrate support 60) for a short time, for example for less than 3 seconds, or for 0.1 second to 3 seconds. The conductive or semi-conductive element 100, 200, 300, 400 may be connected to electrical ground. Alternatively, a positive voltage in that voltage range may be applied to the conductive or semi-conductive element 100, 200, 300, 400, and the substrate support 60 connected to ground.

Applying a low voltage continuously, or a moderate voltage for a short time, allows operation of the present invention during the substrate processing cycle of a lithographic apparatus, or in-line. This is because a low voltage will not interfere with process parameters or sensor measurements during production. The inventive system may thus operate during a substrate processing cycle of a lithographic apparatus, so as to prevent or reduce oxidation during a substrate processing cycle. The substrate support 60 does not have to be removed from a lithographic apparatus. The throughput of a lithographic apparatus is thus not, or only minimally, affected. A positive potential may be applied to the conductive or semi-conductive element 100, 200, 300, 400 during loading and unloading of a substrate W, such that production of the lithographic apparatus is not, or only minimally, interfered with.

The charging device 120 may also apply a positive potential to the conductive or semi-conductive element 100, 200, 300, 400 with respect to the substrate support 60 for the purpose of removing oxide from the substrate support 60 (as in the embodiments of FIGS. 6 and 7). In each of the embodiments of FIGS. 6 and 7, the charging device 120 may apply a positive voltage in the range from 30V to 5000V to the conductive or semi-conductive element 100, 200, 300, 400, so as to apply a positive potential in the range from 30V to 5000V to the conductive or semi-conductive element 100, 200, 300, 400 with respect to the substrate support 60. The substrate support 60 is connected to electrical ground. Alternatively, a negative voltage in that voltage range may be applied to the substrate support 60, and the conductive or semi-conductive element 100, 200, 300, 400 connected to ground.

Applying a high voltage in the range from 1000V to 5000V to the substrate support 60 accelerates the removal of oxides. However, applying such a high voltage is preferably done off-line, so not during the substrate processing cycle of a lithographic apparatus, so as not to interfere with process parameters or influence sensor measurements. A high voltage may be applied in a stand-alone system that is separate from the lithographic apparatus, such that the substrate support 60 is removed from the lithographic apparatus prior to applying the voltage to remove oxide from a substrate support 60. A high voltage may also be applied while the substrate support 60 is within the lithographic apparatus, for example during regular mechanical cleaning of the substrate support 60 with a treatment tool 400. A voltage in the range from 30V to 5000V, or preferably a voltage in the range from 30V to 100V, may be applied when a substrate W is not held by the substrate support 60, such that production of the lithographic apparatus is not interfered with. This has the advantage that an oxide may be removed from the substrate support 60 in-line, reducing the downtime of a lithographic apparatus as a substrate support 60 does not have to be removed or replaced. For example, a higher voltage may be applied during loading and unloading of a substrate W, or when a dummy substrate 300 not intended for lithographic processing is held by the substrate support 60, or during cleaning of the substrate support 60 with a mechanical treatment tool 400. Applying a voltage in the range from 30V to 1000V to the dummy substrate 300 or mechanical treatment tool 400 or a voltage in the range from −30 to −1000V to the substrate support 60, or further preferably from 30V to 45V, ensures that sensors in the lithographic apparatus are not interfered with and reduces the risk of damage to sensors and other components of the lithographic apparatus.

A lithographic apparatus may comprise the system that is described above and schematically shown in FIGS. 4 to 7. Such a lithographic apparatus has the substrate table WT and the substrate support 60. The substrate table WT holds the substrate support 60. The charging device 120 may apply a positive potential to the conductive or semi-conductive element 100, 200, 300, 400 with respect to the part of the substrate support 60 that is covered by the conductive or semi-conductive element 100, 200, 300, 400 periodically, so as to operate periodically. The charging device 120 may operate at only a specific time or at only specific times during a substrate processing cycle of the lithographic apparatus, for example during loading and/or unloading of the substrate W onto and/or from the substrate support 60, or during cleaning of the substrate support 60. This is advantageous as operating the charging device 120 at such specific times can ensure that the lithographic processing of the substrate W in the lithographic apparatus is not or only minimally interfered with.

The charging device 120 may operate multiple times during a substrate processing cycle, and may apply a different potential each time it operates. The charging device 120 may not operate while the substrate W is processed by a lithographic apparatus. The charging device 120 may operate once per day, or once a week, or once in a predetermined (e.g. user selected) period of time. The charging device 120 may be configured to operate at a frequency less than the frequency of substrate W processing, or to not operate during every substrate processing cycle. This has the advantage that the throughput of a lithographic apparatus remains high or is only minimally affected.

The charging device 120 may operate once while the lithographic apparatus processes a batch of substrates, for example after the lithographic apparatus has processed at least two substrates W. The charging device 120 may operate only when a predetermined substrate is present in the lithographic apparatus. This is advantageous, for example, if the conductive or semi-conductive element 100, 200, 300, 400 is embodied by a dummy substrate 300 that is not intended for lithographic processing, and the predetermined substrate is the dummy substrate 300. The charging device 120 may operate only when the conductive or semi-conductive element 100, 200, 300, 400 of any of the embodiments of FIGS. 4 to 7 is in contact with the substrate support 60.

The system of any of FIGS. 4 to 7 may be used in a method to reduce oxidation or remove an oxide from a substrate support 60. Such a method comprises contacting the substrate support 60 with the conductive or semi-conductive element 100, 200, 300, 400 such that at least part of the substrate support 60 is covered by the conductive or semi-conductive element 100, 200, 300, 400. A positive potential is applied to the conductive or semi-conductive element 100, 200, 300, 400 with respect to the part of the substrate support 60 that is covered by the conductive or semi-conductive element 100, 200, 300, 400. The positive potential may be applied by the charging device 120. The conductive or semi-conductive element 100, 200, 300, 400 may be loaded onto the substrate support 60, such that the conductive or semi-conductive element 100, 200, 300, 400 contacts the substrate support 60. The conductive or semi-conductive element 100, 200, 300, 400 may also be unloaded from the substrate support 60.

FIGS. 4 and 5 illustrate schematically two specific examples of a system according to the present invention. The systems of FIGS. 4 and 5 may be used for the purpose of preventing, or at least reducing the rate of, oxide growth on a substrate support 60. The systems of FIGS. 4 and 5 may be used within a lithographic apparatus. The systems of FIGS. 4 and 5 may be used in-line in a lithographic apparatus during a substrate processing cycle of the lithographic apparatus.

FIG. 4 schematically shows a substrate support 60. A substrate W, 100 is held by the terminal surfaces of the burls 20 of the substrate support 60. In the system of FIG. 4, the substrate W is an example of a conductive or semi-conductive element 100, 200, 300, 400. The substrate W, 100 covers an upper surface of the substrate support 60. The substrate W, 100 is held by the terminal surfaces of the burls 20 of the substrate support 60, such that the substrate W, 100 covers the terminal surfaces of the burls 20 of the substrate support 60. E-pins 91 extend through through-holes 89 of the substrate support 60 and are in electrical contact with the substrate W, 100. The e-pins 91 are an example of actuatable pins each projecting through a hole 89 in the substrate support 60. The e-pins 91 connect the substrate W, 100 to electrical ground. An electrical power supply is electrically connected to the substrate support 60. The electrical power supply is an example of a charging device 120. A lithographic apparatus may comprise the system of FIG. 4. Such a lithographic apparatus has a substrate table WT which includes the substrate support 60 of FIG. 4. The projection system PS of the lithographic apparatus may project a patterned radiation beam B onto the substrate W, 100 of FIG. 4. A method of using the system of FIG. 4 may comprise projecting a patterned radiation beam B onto the substrate 100, which is an example of the conductive or semi-conductive element 100, 200, 300, 400.

The electrical power supply applies a negative voltage to the substrate support 60, such that the electrical power supply applies a positive potential to the substrate W, 100 with respect to the part of the substrate support 60 that is covered by the substrate W, 100. The electrical power supply may continuously apply a negative voltage in the range from −0.1 to −10, or preferably in the range from −1V to −5V, to the substrate support 60. Alternatively, the electrical power supply may apply a negative voltage in the range from −5V to −100V to the substrate support 60 for a short time, for example less than 3 seconds. The electrical power supply may apply a voltage in the manner and within a voltage range as generally discussed above. This voltage may be applied during loading and/or unloading of the substrate W, 100 onto and/or from the substrate support 60. This ensures that exposure of the substrate W, 100 by a projection beam, and sensor measurements during exposure, is not interfered with. Preferably, a loading and unloading device of the lithographic apparatus (not shown) loads the substrate W, 100 onto the substrate support 60 and unloads the substrate W, 100 from the substrate support 60.

FIG. 5 schematically shows a substrate support 60 with a metal layer 200 applied to the main body surface 22 of the substrate support 60, from which a plurality of burls 20 project. The metal layer 200 is an example of a conductive or semi-conductive element 100, 200, 300, 400. The metal layer 200 is placed in between the burls 20 of the substrate support 60, so as to cover part of the substrate support 60. The metal layer 200 covers a part of the upper surface of the substrate support 60 that is in between the burls 20. The metal layer 200 is electrically connected to an electrical power supply. The electrical power supply is an example of a charging device 120. The substrate support 60 is connected to electrical ground. A lithographic apparatus may comprise the system of FIG. 5. Such a lithographic apparatus has the substrate table WT which includes the substrate support 60 of FIG. 5. The lithographic apparatus may load or unload a substrate W onto the terminal surfaces of the burls 20 of the substrate support 60 of FIG. 5.

The charging device 120, e.g., electrical power supply, applies a positive voltage to the metal layer 200, so as to apply a positive potential to the metal layer 200 with respect to the part of the substrate support 60 that is covered by the metal layer 200. The metal layer 200 may also have a positive potential with respect to the terminal surfaces of the burls 20 of the substrate support 60. The electrical power supply may apply a positive voltage to the metal layer 200 of a value as described above in relation to the substrate 100, W of FIG. 4. Preferably, this voltage is applied when the substrate W is not processed by a lithographic apparatus comprising the system of FIG. 5. The electrical power supply may operate when no substrate W is held by the substrate support 60. For example, the electrical power supply may apply a voltage to the metal layer 200 during loading and/or unloading of the substrate W onto and/or from the substrate support 60 or during mechanically cleaning of the substrate support 60 with a treatment tool 400. This ensures that production of a lithographic apparatus is not interfered with.

FIGS. 6 and 7 illustrate schematically two further specific embodiments of a system according to the present invention. The systems of FIGS. 6 and 7 may be used for the purpose of removing oxide from the substrate support 60. This is done by reversing the mechanism that drives oxidation of the substrate support 60. The systems of FIGS. 6 and 7 may be used within a lithographic apparatus, or may be stand-alone systems for removing oxides from the substrate support 60 that has been removed from a lithographic apparatus.

To accelerate the removal of oxide from the substrate support 60 of FIGS. 6 and 7, an electrolyte 140 may be (deliberately) provided between the substrate support 60 and a conductive or semi-conductive element 100, 200, 300, 400. The electrolyte 140 may at least partially fill a space between the substrate support 60 and the conductive or semi-conductive element 100, 200, 300, 400, such that the electrolyte 140 is in contact with both the substrate support 60 and the conductive or semi-conductive element 100, 200, 300, 400. The electrolyte 140 may be provided in a space that is covered by the conductive or semi-conductive element 100, 200, 300, 400. The electrolyte 140 may fill a space between a plurality of burls 20 of the substrate support 60. The electrolyte 140 may cover the upper surface of the substrate support 60 from which the plurality of burls 20 project. The electrolyte 140 may fill a space between SiC grains present at the terminal surfaces of the burls 20, which SiC grains may be in direct contact with the conductive or semi-conductive element 100, 200, 300, 400. The electrolyte 140 may be a liquid or a gas. The electrolyte 140 may be water, water vapour or humid air. The electrolyte 140 may alternatively be an HF or KOH containing solution. Special care should be taken when using such hazardous materials as an electrolyte 140. In an alternative embodiment, the electrolyte 140 may be naturally present in the system or in a lithographic apparatus, for example in the form of humid air that surrounds the system or a lithographic apparatus.

A thermal conditioning device 180 may thermally condition the conductive or semi-conductive element 100, 200, 300, 400 such that the electrolyte 140 condenses on the conductive or semi-conductive element 100, 200, 300, 400. For example, the thermal conditioning device 180 may be a cooling device that cools the conductive or semi-conductive element 100, 200, 300, 400 (possibly through thermal contact with the substrate table WT which includes a thermal conditioning device 180) such that humid air condenses on the surface of the conductive or semi-conductive element 100, 200, 300, 400 so as to form water droplets (embodying the electrolyte 140) thereon. The cooling device may be a Peltier device. The cooling device may cool the conductive or semi-conductive element 100, 200, 300, 400 to a temperature at or below the dew point temperature. These water droplets may at least partially fill a space between the conductive or semi-conductive element 100, 200, 300, 400 and the substrate support 60. An electrolyte supply device 160 may, alternatively or in addition, supply the electrolyte 140. The electrolyte supply device 160 may at least partially fill the space between the conductive or semi-conductive element 100, 200, 300, 400 with the electrolyte 140. The electrolyte supply device 160 may, for example, be a sponge or other supply embedded in the conductive or semi-conductive element 100, 200, 300, 400. This has the advantage that the electrolyte 140 can be provided by the system independently from the lithographic apparatus or other machine it is used in. The electrolyte supply device 160 may, alternatively, be external to the conductive or semi-conductive element 100, 200, 300, 400. The electrolyte supply device 160 may supply the electrolyte 140 before the conductive or semi-conductive element 100, 200, 300, 400 is brought into contact with the substrate support 60, or while the conductive or semi-conductive element 100, 200, 300, 400 is in contact with the substrate support 60 and before the charging device 120 applies a positive potential to the conductive or semi-conductive element 100, 200, 300, 400 with respect to the substrate support 60. A method of using the system of FIGS. 6 and 7 may comprise at least partially filling a space between the substrate support 60 and the conductive or semi-conductive element 100, 200, 300, 400 with the electrolyte 140, and/or thermally conditioning the conductive or semi-conductive element 100, 200, 300, 400 such that the electrolyte 140 condenses on the conductive or semi-conductive element 100, 200, 300, 400.

FIG. 6 schematically illustrates a substrate support 60. The substrate support 60 holds a dummy substrate 300. The dummy substrate 300 is one example of a conductive or semi-conductive element 100, 200, 300, 400. The dummy substrate 300 preferably has the same dimensions as the substrate W, such that it is held by the substrate support 60 in the same manner as the substrate W. The dummy substrate 300 is, however, not processed by a lithographic apparatus. The dummy substrate 300 might or might not comprise a photoresist for the development of a pattern therein. The dummy substrate 300 contacts the terminal surfaces of the burls 20 of the substrate support 60, and covers the main body surface 22 of the substrate support 60, as described in relation to the substrate W, 100 of FIG. 4. The electrolyte 140 partly fills a space between the substrate support 60 and the dummy substrate 300. The electrolyte 140 may be provided by the electrolyte supply device 160, such as a sponge or other supply external to the dummy substrate 300. Alternatively, the electrolyte supply device 160 may be embedded in the dummy substrate 300 (not shown). A thermal conditioning device 180 may be provided, alternatively or additionally, for thermally conditioning the dummy substrate 300 such that the electrolyte 140 condenses on the surface of the dummy substrate 300. The thermal conditioning device 180 may be external to the dummy substrate 300 (as shown in FIG. 6) or may be embedded in the dummy substrate 300.

A lithographic apparatus may comprise the system of FIG. 6. Such a lithographic apparatus has a substrate table WT and the substrate support 60 of FIG. 6. The dummy substrate 300 may be loaded onto the substrate support 60 in place of the substrate W. For example, a dummy substrate 300 may be loaded onto the substrate support 60 periodically, for example once a day or once while the lithographic apparatus processes a batch of substrates W (e.g. at least two substrates W).

An external electrical power supply or an embedded battery applies a positive voltage or bias to the dummy substrate 300. The external electrical power supply and the embedded battery are examples of a charging device 120. The substrate support 60 may be electrically grounded. The external electrical power supply or other charging device 120 may apply a voltage only when the dummy substrate 300 is held by the substrate support 60. The external electrical power supply or other charging device 120 may not apply a voltage when the substrate W is held by the substrate support 60. The external electrical power supply or the other charging device 120 may apply a positive voltage in the range from 30V to 5000V to the dummy substrate 300, or may apply a voltage as described generally above. The positive voltage may be applied until all or substantially all of the oxide on the substrate support 60 has been removed. The positive voltage may be applied, for example, for a duration ranging from 5 to 180 minutes. The duration may depend on the degree of oxidation of the substrate support 60, how often the dummy substrate 300 is used to remove oxide from the substrate support 60, the positive voltage applied to the substrate support 60, and the type of electrolyte 140 present in the system.

FIG. 7 schematically illustrates further specific embodiments of to the present invention. Compared to the system of FIG. 6, a treatment tool 400 is provided in place of the dummy substrate 300. The treatment tool 400 is an example of a conductive or semi-conductive element 100, 200, 300, 400. The treatment tool 400 may be for mechanically cleaning the substrate support 60. The treatment tool 400 may be a conventional cleaning stone. The cleaning stone may be a granite or other cleaning stone. During cleaning of the substrate support 60 with the treatment tool 400, the treatment tool 400 is supported on the terminal surfaces of the burls 20. That is, the treatment tool 400 rests on the substrate support 60 by its own weight. As such, the treatment tool 400 is in contact with the terminal surfaces of at least some of the burls 20 of the substrate support 60. The treatment tool 400 thus covers part of the substrate support 60.

The treatment tool 400 may be arranged for rotation around an axis perpendicular to the surface of the substrate support 60, for example by rotation of a shaft. Material is removed due to the movement of the treatment tool 400 over the terminal surfaces of the burls 20 mainly due to the rotation of the treatment tool 400. Relative translational movement in the x and y directions of the treatment tool 400 relative to the substrate support 60 means that the whole top surface of the substrate support 60 can be moved under the treatment tool 400 such that all burls 20 can be cleaned. The treatment tool 400 may thus effectively be moved across the whole surface of the substrate support 60, so as to contact and cover different parts of the substrate support 60 at different times. The treatment tool 400 can thus remove an oxide from substantially the whole surface of the substrate support 60.

The electrolyte 140 may partly fill the space between the treatment tool 400 and the substrate support 60. The electrolyte 140 may be provided by an electrolyte supply device 160 embedded in the treatment tool 400, as shown in FIG. 7. Alternatively or additionally, the electrolyte 140 may condense on the treatment tool 400 after thermal conditioning thereof by a thermal conditioning device 180 embedded in the treatment tool 400. Alternatively, the electrolyte supply device 160 or the thermal conditioning device 180 may be external to the treatment tool 400, as described in relation to the dummy substrate 300 of FIG. 6. The charging device 120, such as an external electrical power supply or an embedded battery, applies a positive voltage or bias to the treatment tool 400 with respect to the electrically grounded substrate support 60. Alternatively, the treatment tool 400 may be grounded and a negative voltage or bias applied to the substrate support 60. The size of the voltage, and the duration that the voltage is applied, may be as described in relation to the dummy substrate 300 of FIG. 6. The charging device 120 may apply the voltage during mechanical cleaning of the substrate support 60 by the treatment tool 400. The charging device 120 may apply a positive potential to the treatment tool 400 continuously while the treatment tool 400 is moved across a substrate support 60. Alternatively, the charging device 120 may apply the positive potential periodically, such that the positive potential is applied to the treatment tool 400 when the treatment tool 400 has been moved to a new position.

A lithographic apparatus may comprise the system of FIG. 7. Such a lithographic apparatus has the substrate table WT and the substrate support 60 of FIG. 7. The treatment tool 400 may be part of the lithographic apparatus. The treatment tool 400 may be used periodically to clean the substrate support 60 of the lithographic apparatus. Cleaning of the substrate support 60 may be performed on a predetermined schedule based on a time or number of substrates W placed on the substrate support 60, for example. Cleaning may take place periodically and/or as the result of detection of contamination, either by direct measurement of the substrate support 60 or during level measurements of the substrate W loaded to the substrate support 60. The cleaning efficiency of the treatment tool 400 is improved using the system of FIG. 7, as both mechanical and electrochemical removal of oxides and other contaminants is enabled. A method of using the system of FIG. 7 may comprise mechanically cleaning the substrate support 60 with the treatment tool 400, which is an example of a conductive or semi-conductive element 100, 200, 300, 400.

Specific embodiments have been described with reference to FIGS. 4 to 7. The skilled person would understand that features of these embodiments may be combined where appropriate. For example, the skilled person would understand that the manner in which the charging device 120 applies a positive potential to the conductive or semi-conductive element 100, 200, 300, 400 with respect to the a substrate support 60, the times at which the positive potential is applied, and the value of the positive potential, may be implemented as described throughout this description. In the system of FIG. 4, the substrate W, 100 could be grounded by means of the liquid confinement structure 12 instead of the e-pins 91. A negative bias could be applied to the substrate support 60 by an electrode embedded in the substrate support 60. Further, the substrate support 60 could be connected to ground, or neither component be grounded, and a positive voltage could be applied to the substrate W, 100 by an electrical power supply via the e-pins 91 or the liquid confinement structure 12, or by a radiation beam or an air flow, or in any other manner. Similarly, the positive potential to the conductive or semi-conductive element 100, 200, 300, 400 could be applied in any such manner in the systems of FIGS. 5 to 7.

Embodiments are described in the following clauses:

1. A system comprising:
    a substrate support configured to hold a substrate;
    a conductive or semi-conductive element contacting the substrate support and covering at least part of the substrate support; and
    a charging device configured to apply a positive potential to the conductive or semi-conductive element with respect to the part of the substrate support that is covered by the conductive or semi-conductive element.

2. The system of clause 1, wherein the substrate support has a main body and a plurality of burls projecting from a main body surface of the main body, each burl having a terminal end surface configured to contact a surface of a substrate thereby to hold the substrate, and
    wherein the charging device is configured to apply the positive potential to the conductive or semi-conductive element with respect to the terminal end surfaces of the plurality of burls of the substrate support.

3. The system of clause 1 or clause 2, wherein the positive potential is in the range from 1 V to 100V, and preferably from 30V to 45V.

4. The system of any of the preceding clauses, wherein the substrate support is electrically grounded and a positive potential is applied to the conductive or semi-conductive element, or wherein the conductive or semi-conductive element is electrically grounded and a negative potential is applied to the substrate support.

5. The system of any of the preceding clauses, comprising an electrolyte, wherein the electrolyte at least partially fills a space between the substrate support and the conductive or semi-conductive element.

6. The system of clause 5, further comprising an electrolyte supply device configured to at least partially fill the space with the electrolyte.

7. The system of any of the preceding clauses, further comprising a thermal conditioning device configured to thermally condition the conductive or semi-conductive element such that an or the electrolyte condenses on the conductive or semi-conductive element.

8. The system of any of the preceding clauses, wherein the charging device is configured to apply the positive potential only during loading and unloading of a substrate on the substrate support, and/or only during cleaning of the substrate support.

9. The system of any of the preceding clauses, wherein the charging device comprises an electrical power supply embedded in the conductive or semi-conductive element, or wherein the charging device comprises an electrical power supply configured to apply the positive potential to the conductive or semi-conductive element via actuatable pins each projecting through a hole in the substrate support, or
    wherein the charging device comprises an electrical power supply configured to apply the positive potential to the conductive or semi-conductive element via a liquid confinement structure for confining a liquid on a or the substrate held by the substrate support, or
    wherein the charging device comprises an air shower and an ionizer and is configured to direct an ionized air flow over the conductive or semi-conductive element.

10. The system of any of the preceding clauses, wherein the conductive or semi-conductive element comprises any one of:
    a substrate held by the substrate support, the substrate comprising a photoresist for development of a pattern therein,
    a dummy substrate held by the substrate support,
    a metal layer applied to a or the main body surface of the substrate support from which a or the plurality of burls project, and/or
    a treatment tool for mechanically cleaning the substrate support.

11. A lithographic apparatus comprising:
    a substrate table that comprises a substrate support configured to hold a substrate,
    a loading device configured to load a conductive or semi-conductive element onto the substrate support, so that the conductive or semi-conductive element contacts the substrate support and covers at least part of the substrate support, and
    a charging device configured to apply a positive potential to a conductive or semi-conductive element contacted by the substrate support with respect to the part of the substrate support that is covered by the conductive or semi-conductive element.

12. The lithographic apparatus of clause 11, further comprising a projection system configured to project a patterned radiation beam onto the conductive or semi-conductive element.

13. The lithographic apparatus of clause 11 or clause 12, wherein the charging device is configured to operate periodically, and/or at a specific time or at specific times during a substrate processing cycle of the lithographic apparatus, and/or at a frequency less than the frequency of substrate processing.

14. A method for reducing oxidation or removing oxide on a substrate support, the method comprising:
    contacting the substrate support with a conductive or semi-conductive element such that at least part of the substrate support is covered by the conductive or semi-conductive element, and
    applying a positive potential to the conductive or semi-conductive element with respect to the part of the substrate support that is covered by the conductive or semi-conductive element.

15. The method of clause 14, further comprising:
    at least partially filling a space between the substrate support and the conductive or semi-conductive element with an electrolyte, and/or
    thermally conditioning the conductive or semi-conductive element so that the electrolyte condenses on the conductive or semi-conductive element.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

While specific embodiments of the invention have been described above, it will be appreciated that the invention may be practiced otherwise than as described.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage media for storing such computer programs, and/or hardware to receive such media. So the controller(s) may operate according the machine readable instructions of one or more computer programs.

The descriptions above are intended to be illustrative, not limiting. Thus, it will be apparent to one skilled in the art that modifications may be made to the invention as described without departing from the scope of the claims set out below.

The invention claimed is:

1. A system comprising:
a substrate support configured to hold a substrate, the substrate support comprising one or more openings configured to exhaust gas so as to clamp the substrate to the substrate support;
a conductive or semi-conductive element contacting, or configured to contact, the substrate support and covering, or configured to cover, at least part of the substrate support; and
a charging device configured to apply a positive potential to the conductive or semi-conductive element with respect to the part of the substrate support that is covered by the conductive or semi-conductive element.

2. The system of claim 1, wherein the substrate support has a main body and a plurality of burls projecting from a main body surface of the main body, each burl having a terminal end surface configured to contact a surface of a substrate to support the substrate, and
wherein the charging device is configured to apply the positive potential to the conductive or semi-conductive element with respect to the terminal end surfaces of the plurality of burls of the substrate support.

3. The system of claim 1, wherein the positive potential is a continuous voltage in the range from 0.1V to 10V.

4. The system of claim 1, wherein the substrate support is electrically grounded and a positive potential is applied to the conductive or semi-conductive element, or
wherein the conductive or semi-conductive element is electrically grounded and a negative potential is applied to the substrate support.

5. The system of claim 1, comprising an electrolyte, wherein the electrolyte at least partially fills a space between the substrate support and the conductive or semi-conductive element.

6. The system of claim 5, further comprising an electrolyte supply device configured to at least partially fill the space with the electrolyte.

7. The system of claim 1, further comprising a thermal conditioning device configured to thermally condition the conductive or semi-conductive element such that an electrolyte condenses on the conductive or semi-conductive element.

8. The system of claim 1, wherein the charging device is configured to apply the positive potential: only during loading and unloading of a substrate on the substrate support, and/or only during cleaning of the substrate support.

9. The system of claim 1, wherein the charging device comprises an electrical power supply embedded in the conductive or semi-conductive element, or
wherein the charging device comprises an electrical power supply configured to apply the positive potential to the conductive or semi-conductive element via actuatable pins each projecting through a hole in the substrate support, or
wherein the charging device comprises an electrical power supply configured to apply the positive potential to the conductive or semi-conductive element via a liquid confinement structure for confining a liquid on a substrate held by the substrate support, or
wherein the charging device comprises an air shower and an ionizer and is configured to direct an ionized air flow over the conductive or semi-conductive element.

10. The system of claim 1, wherein the conductive or semi-conductive element comprises any one selected from:
a substrate held by the substrate support, the substrate comprising a photoresist for development of a pattern therein,
a dummy substrate held by the substrate support,
a metal layer applied to a main body surface of the substrate support from which a plurality of burls project, or
a treatment tool for mechanically cleaning the substrate support.

11. A lithographic apparatus comprising:
a substrate table that comprises a substrate support configured to hold a substrate, the substrate support comprising one or more openings configured to exhaust gas so as to clamp the substrate to the substrate support,
a loading device configured to load a conductive or semi-conductive element onto the substrate support, so that the conductive or semi-conductive element contacts the substrate support and covers at least part of the substrate support, and
a charging device configured to apply a positive potential to a conductive or semi-conductive element contacted by the substrate support with respect to the part of the substrate support that is covered by the conductive or semi-conductive element.

12. The lithographic apparatus of claim 11, further comprising a projection system configured to project a patterned radiation beam onto the conductive or semi-conductive element.

13. The lithographic apparatus of claim 11, wherein the charging device is configured to operate: periodically, and/or at a specific time or at specific times during a substrate processing cycle of the lithographic apparatus, and/or at a frequency less than the frequency of substrate processing.

14. A method for reducing oxidation or removing oxide on a substrate support, the method comprising:
exhausting gas through one or more openings of the substrate support so as to clamp the substrate to the substrate support;
contacting the substrate support with a conductive or semi-conductive element such that at least part of the substrate support is covered by the conductive or semi-conductive element, and
applying a positive potential to the conductive or semi-conductive element with respect to the part of the substrate support that is covered by the conductive or semi-conductive element.

15. The method of claim 14, further comprising:
at least partially filling a space between the substrate support and the conductive or semi-conductive element with an electrolyte, and/or
thermally conditioning the conductive or semi-conductive element so that an electrolyte condenses on the conductive or semi-conductive element.

16. The method of claim 14, wherein the positive potential is a continuous voltage in the range from 0.1V to 10V.

17. The method of claim 14, wherein an electrolyte at least partially fills a space between the substrate support and the conductive or semi-conductive element.

18. The lithographic apparatus of claim 11, wherein the positive potential is a continuous voltage in the range from 0.1V to 10V.

19. The lithographic apparatus of claim 11, wherein the substrate support is electrically grounded and a positive potential is applied to the conductive or semi-conductive element, or wherein the conductive or semi-conductive element is electrically grounded and a negative potential is applied to the substrate support.

20. The lithographic apparatus of claim 11, comprising an electrolyte, wherein the electrolyte at least partially fills a space between the substrate support and the conductive or semi-conductive element and/or an electrolyte supply device configured to at least partially fill the space with the electrolyte.

21. A system comprising:
- a substrate support configured to hold a substrate;
- a conductive or semi-conductive element contacting, or configured to contact, the substrate support and covering, or configured to cover, at least part of the substrate support;
- an electrolyte that at least partially fill a space between the substrate support and the conductive or semi-conductive element; and
- a charging device configured to apply a positive potential to the conductive or semi-conductive element with respect to the part of the substrate support that is covered by the conductive or semi-conductive element.

* * * * *